United States Patent
Sha et al.

(10) Patent No.: US 10,831,976 B1
(45) Date of Patent: Nov. 10, 2020

(54) PREDICTING LOCAL LAYOUT EFFECTS IN CIRCUIT DESIGN PATTERNS

(71) Applicant: International Business Machines Corporation, Armonk, NY (US)

(72) Inventors: Jing Sha, White Plains, NY (US); Dongbing Shao, Wappingers Falls, NY (US); Yufei Wu, Poughkeepsie, NY (US); Zheng Xu, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/427,321

(22) Filed: May 30, 2019

(51) Int. Cl.
| | | |
|---|---|---|
| *G06F 30/398* | (2020.01) | |
| *G06N 20/00* | (2019.01) | |
| *G06K 9/62* | (2006.01) | |
| *G06N 3/04* | (2006.01) | |
| *G06N 3/08* | (2006.01) | |

(52) U.S. Cl.
CPC ......... *G06F 30/398* (2020.01); *G06K 9/6223* (2013.01); *G06N 3/0454* (2013.01); *G06N 3/088* (2013.01); *G06N 20/00* (2019.01)

(58) Field of Classification Search
USPC ......................................................... 716/112
See application file for complete search history.

(56) References Cited

U.S. PATENT DOCUMENTS

| | | | |
|---|---|---|---|
| 8,402,397 B2 | 3/2013 | Robles et al. | |
| 8,464,194 B1 | 6/2013 | Agarwal et al. | |
| 9,064,072 B2 | 6/2015 | Brown | |
| 9,626,459 B2 | 4/2017 | Agarwal et al. | |
| 9,646,124 B2 | 5/2017 | Chidambarrao et al. | |
| 2008/0320421 A1 | 12/2008 | Demaris et al. | |
| 2014/0358830 A1 | 12/2014 | Chiang et al. | |
| 2019/0325321 A1* | 10/2019 | Swanson | G06K 9/6218 |
| 2020/0004918 A1* | 1/2020 | Sha | G03F 1/70 |
| 2020/0004921 A1* | 1/2020 | Baidya | G06K 9/6232 |

(Continued)

OTHER PUBLICATIONS

Shang et al., "High performance bulk planar 20nm CMOS technology for low power mobile applications," Symposium on VLSI Technology (VLSIT), 2012, pp. 129-130.

(Continued)

*Primary Examiner* — Mohammed Alam
(74) *Attorney, Agent, or Firm* — Robert Sullivan; Otterstedt, Wallace & Kammer, LLP

(57) ABSTRACT

A method for predicting local layout effect in a circuit design pattern includes obtaining a plurality of circuit design patterns, generating layout images from the circuit design patterns, extracting feature vectors from the layout images by processing the layout images in a computer vision machine learning algorithm, comparing the feature vector extracted from a selected layout image to clusters of feature vectors extracted from the layout images, wherein the clusters of feature vectors include an in-range cluster and an outlier cluster, and labelling a circuit design pattern corresponding to the selected layout image, for which threshold voltage has not been experimentally measured, as being an in-range circuit design pattern or an outlier circuit design pattern, in response to the selected layout image respectively correlating with the in-range cluster or with the outlier cluster.

20 Claims, 9 Drawing Sheets

(56) References Cited

U.S. PATENT DOCUMENTS

2020/0050099 A1* 2/2020 Su .................. G06N 20/10
2020/0057824 A1* 2/2020 Yeh ................. G06N 20/00

OTHER PUBLICATIONS

Yang et al., "10nm high performance mobile SoC design and technology co-developed for performance, power, and area scaling," Symposium on VLSI Technology, 2017, pp. T70-T71.

Yu et al., "Machine learning and pattern matching in physical design." 20th Asia and South Pacific Design Automation Conference (ASP-DAC), 2015, pp. 286-293.

Watanabe et al., "Accurate lithography simulation model based on convolutional neural networks," Proc. of SPIE, vol. 10147, 2017, 101470K, 9 pp.

Matsunawa et al., Automatic layout feature extraction for lithography hotspot detection based on deep neural network, Proc. of SPIE, vol. 9781, 2016, 97810H, 10 pp.

Popat et al., "Review and Comparative Study of Clustering Techniques", International Journal of Computer Science and Information Technologies, vol. 5 (1), Jan. 2014. pp. 805-812.

Van Der Maaten, et al., "Dimensionality Reduction: A Comparative Review", TICC TR 2009-005, Jan. 2009. pp. 1-35.

* cited by examiner

PREDICTING LOCAL LAYOUT EFFECTS IN CIRCUIT DESIGN PATTERNS

BACKGROUND

The present invention relates to the electrical, electronic, and computer arts, and more specifically, to integrated circuit design techniques.

In VLSI (very large scale integration) digital design, electrical conductors (metal lines) interconnect the terminals of the electronic components (such as cells, elements, objects, and the like) in the integrated circuit, and vias are used to interconnect the metal lines. As VLSI designs continue to reduce the spacing between adjacent electronic components, increasing proximity of electrically isolated electrical conductors and vias can introduce unexpected electrical couplings between the conductors and/or vias (by capacitance and/or inductance), a phenomenon known as "local layout effect" ("LLE"). Local layout effect is undesirable at least because it can cause circuit threshold voltage to be out of its designed range. (Threshold voltage is the minimum gate-to-source voltage $V_{GS\,(th)}$ that is needed to create a conducting path between the source and drain terminals. It is an important characteristic that determines proper operation of a computational circuit. Out-of-range threshold voltage can produce computational errors.)

In order to detect the presence of local layout effect, it presently is required to measure threshold voltage experimentally on a fully fabricated VLSI circuit. Efforts have been made to simulate circuit performance before fabrication, in order to predict a possibility of local layout effect; however, such efforts have not yet produced confidence in their results. Problems with attempting to simulate LLE arise in part because the phenomenon itself can be caused by stochastic defects in circuit fabrication, which are not accounted for in conventional circuit simulation software.

SUMMARY

Principles of the invention provide techniques for predicting local layout effects in circuit design patterns. In one aspect, an exemplary method for rejecting a circuit design pattern that is predicted to have local layout effect includes obtaining a plurality of circuit design patterns, generating a plurality of layout images each corresponding to one of the plurality of circuit design patterns, training a computer vision machine learning algorithm in an unsupervised fashion to generate a training set of feature vectors for the plurality of layout images, generating a cluster plot of the training set of feature vectors, and identifying an in-range cluster and an outlier cluster on the cluster plot. The method further includes identifying a circuit design pattern that corresponds to a layout image that produced a feature vector within the outlier cluster, and rejecting the identified circuit design pattern. In one or more embodiments, the cluster plot may be many-dimensional, i.e. in excess of three dimensions.

In another aspect, an exemplary method for rejecting circuit design patterns that are predicted to have local layout effect includes obtaining a plurality of circuit design patterns; generating a plurality of layout images each corresponding to one of the plurality of circuit design patterns; training a computer vision machine learning algorithm in an unsupervised fashion to generate a training set of feature vectors for the plurality of layout images; generating a cluster plot of the training set of feature vectors; identifying an in-range cluster and an outlier cluster on the cluster plot; obtaining an inference set of circuit design patterns; generating an inference set of layout images each corresponding to one of the inference set of circuit design patterns; using the computer vision machine learning algorithm to generate an inference set of feature vectors for the inference set of layout images; plotting on the cluster plot the inference set of feature vectors; identifying outlier members of the inference set of layout images that produced feature vectors that overlie the outlier cluster on the cluster plot; and rejecting circuit design patterns that correspond to the outlier members of the inference set of layout images.

In another aspect, an exemplary method for rejecting a circuit design pattern that is predicted to have local layout effect includes obtaining a plurality of circuit design patterns; generating layout images from the circuit design patterns; extracting feature vectors from the layout images by processing the layout images in a computer vision machine learning algorithm; comparing the feature vector extracted from a selected layout image to clusters of feature vectors extracted from the layout images, wherein the clusters of feature vectors include an in-range cluster and an outlier cluster; and rejecting a circuit design pattern corresponding to the selected layout image, for which threshold voltage has not been experimentally measured, as being an outlier circuit design pattern, in response to the feature vector of the selected layout image correlating with the outlier cluster.

One or more embodiments of the invention or elements thereof can be implemented in the form of a computer program product including a computer readable storage medium with computer usable program code for performing or facilitating the method steps indicated. Furthermore, one or more embodiments of the invention or elements thereof can be implemented in the form of a system (or apparatus) including a memory that embodies computer executable instructions, and at least one processor that is coupled to the memory and operative by the instructions to perform or to facilitate exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a tangible computer readable storage medium (or multiple such media) and implemented on a hardware processor, or (iii) a combination of (i) and (ii); any of (i)-(iii) implement the specific techniques set forth herein.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

In view of the foregoing, techniques of the present invention can provide substantial beneficial technical effects. For example, one or more embodiments provide one or more of:

Efficient identification of circuit design patterns that produce unacceptable shifts of threshold voltage.

Identification of in-range circuit design patterns and outlier circuit design patterns before simulation, fabrication, or testing of the designs.

These and other features and advantages of the present invention will become apparent from the following detailed description of illustrative embodiments thereof, which is to be read in connection with the accompanying drawings.

DETAILED DESCRIPTION

Figure 1:
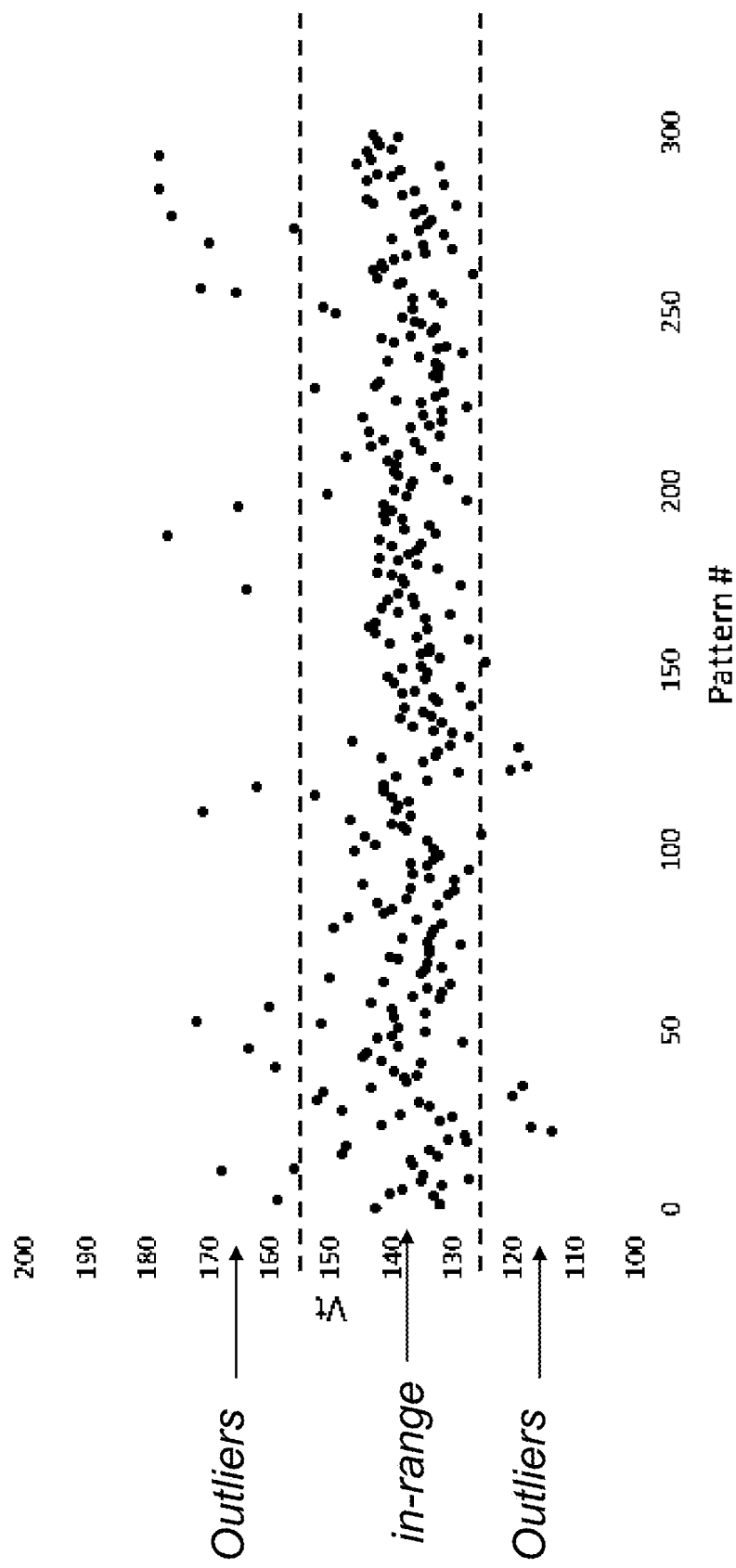
FIG. 1 depicts a plot of threshold voltages corresponding to various circuit design patterns, marked with horizontal lines to indicate in-range values and outlier values of threshold voltage.

Surprisingly, an aspect of the present invention is that local layout effect can be predicted without experimental measurements of threshold voltage and without detailed simulation of circuit performance. This unexpected ability to predict local layout effect can be accomplished by framing the problem as a computer vision problem, in which the power of neural networks can be applied to clipped 3-D images of circuit design patterns.

Generally, a neural network includes a plurality of computer processors that are configured to work together to implement one or more machine learning algorithms. The implementation may be synchronous or asynchronous. In a neural network, the processors simulate thousands or millions of neurons, which are connected by axons and synapses. Each connection is enforcing, inhibitory, or neutral in its effect on the activation state of connected neural units. Each individual neural unit has a summation function which combines the values of all its inputs together. In some implementations, there is a threshold function or limiting function on at least some connections and/or on at least some neural units, such that the signal must surpass the limit before propagating to other neurons. A neural network can implement supervised, unsupervised, or semi-supervised machine learning. There are many types of neural network architecture. Two types are described below as exemplary embodiments of the invention: a convolutional neural network (CNN) and an autoencoder. Variations of these two types, and other types, also may be suitable for implementing the invention as will be understood by an ordinary skilled worker.

One or more embodiments include establishing a neural network, training the neural network in an unsupervised fashion on a set of clipped images of circuit design patterns ("layout images"), clustering principal components of feature vectors produced by the neural network for each of the layout images, and identifying from a cluster plot those layout images that have "outlier" principal components that are expected to correspond to unusual values of threshold voltage (Vt). Other embodiments include establishing a neural network, training the neural network in a supervised fashion on layout images and corresponding measurements of threshold voltage, and applying the trained neural network to layout images for which threshold voltage has not been measured ("working images"), in order to predict whether local layout effect will be present for circuit design patterns corresponding to each of the working images. Yet other embodiments include establishing a neural network, training the neural network in an unsupervised fashion on a set of layout images, clustering principal components of feature vectors produced by the neural network for each of the layout images, experimentally measuring threshold voltage for a sample of points from each cluster of feature vectors, and categorizing the clusters as "in-range" or "outlier" based on the experimental measurements.

For further understanding of the "in-range" and "outlier" terminology, FIG. 1 depicts a plot of threshold voltages (vertical axis) experimentally measured on various actually-fabricated circuit design patterns (horizontal axis), marked with horizontal dashed lines to indicate in-range values and outlier values of threshold voltage (Vt). For example, in-range threshold voltages range between about 125 millivolt (mV) and about 155 mV. Outlier threshold voltages exceed 155 mV or fall below 125 mV. Other values for in-range and outlier voltages may be appropriate depending on design specifications of any given circuit.

Figure 2:
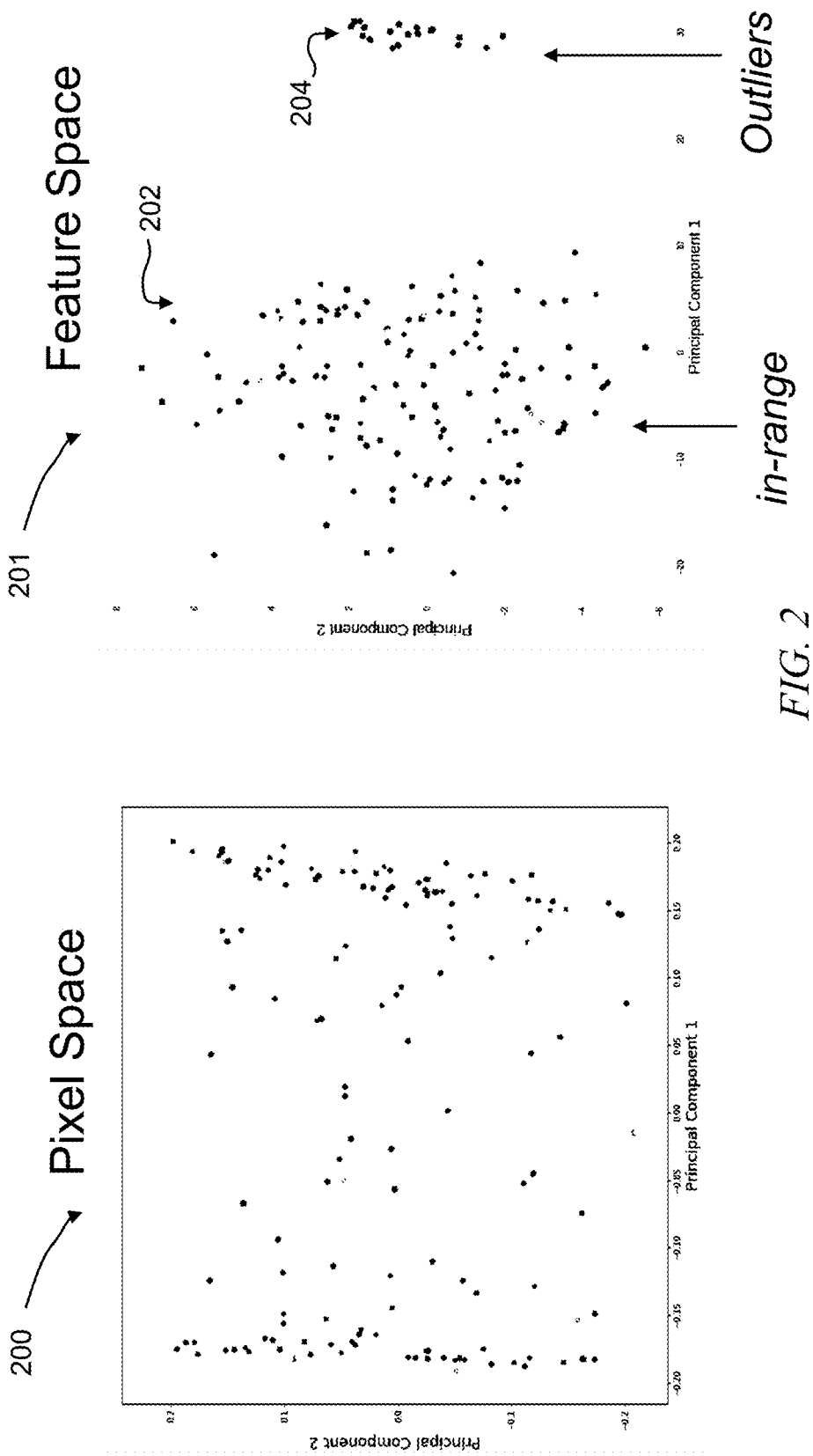
FIG. 2 depicts plots of 2-dimensional principal component analysis (PCA) results and corresponding Vt values, in pixel space and in feature vector space, of in-range and outlier circuit design patterns.

According to one or more embodiments, dimensionality reduction techniques assist in identifying "in-range" and "outlier" groups of layout images. As one example, FIG. 2 depicts plots of 2-dimensional principal component analysis (PCA) results and corresponding Vt values, in pixel space and in feature vector space, of in-range and outlier circuit design patterns. In the left hand plot 200 of FIG. 2 (2-dimensional PCA in pixel space), various values of Vt are scattered across the plot without any clear correlation between the principal components and the Vt values. By contrast, in the right hand plot 201 of FIG. 2 (2-dimensional PCA in feature vector space), values of Vt are clustered into an in-range group 202 and an outlier group 204. The in-range group 202 is at the left side of the right hand plot 201, and includes mid-range values of Vt, i.e. values between about 125 mV and about 155 mV. The outlier group 204 is at the right side of the right hand plot 201, and includes extreme values of Vt, i.e. values in excess of 155 mV or less than 125 mV. FIG. 2 demonstrates that in-range and outlier circuit design patterns can be easily separated into two clusters in the feature vector space, while they are difficult to distinguish in the pixel space. Although PCA is discussed with reference to FIG. 2, other dimensionality reduction techniques equally are applicable, e.g., maximum variance unfolding, diffusion mapping. Note also that there are conventional modeling approaches to correct for the LLE effect, this function was not turned on in the raw data used to generate FIG. 2.

Figure 3:
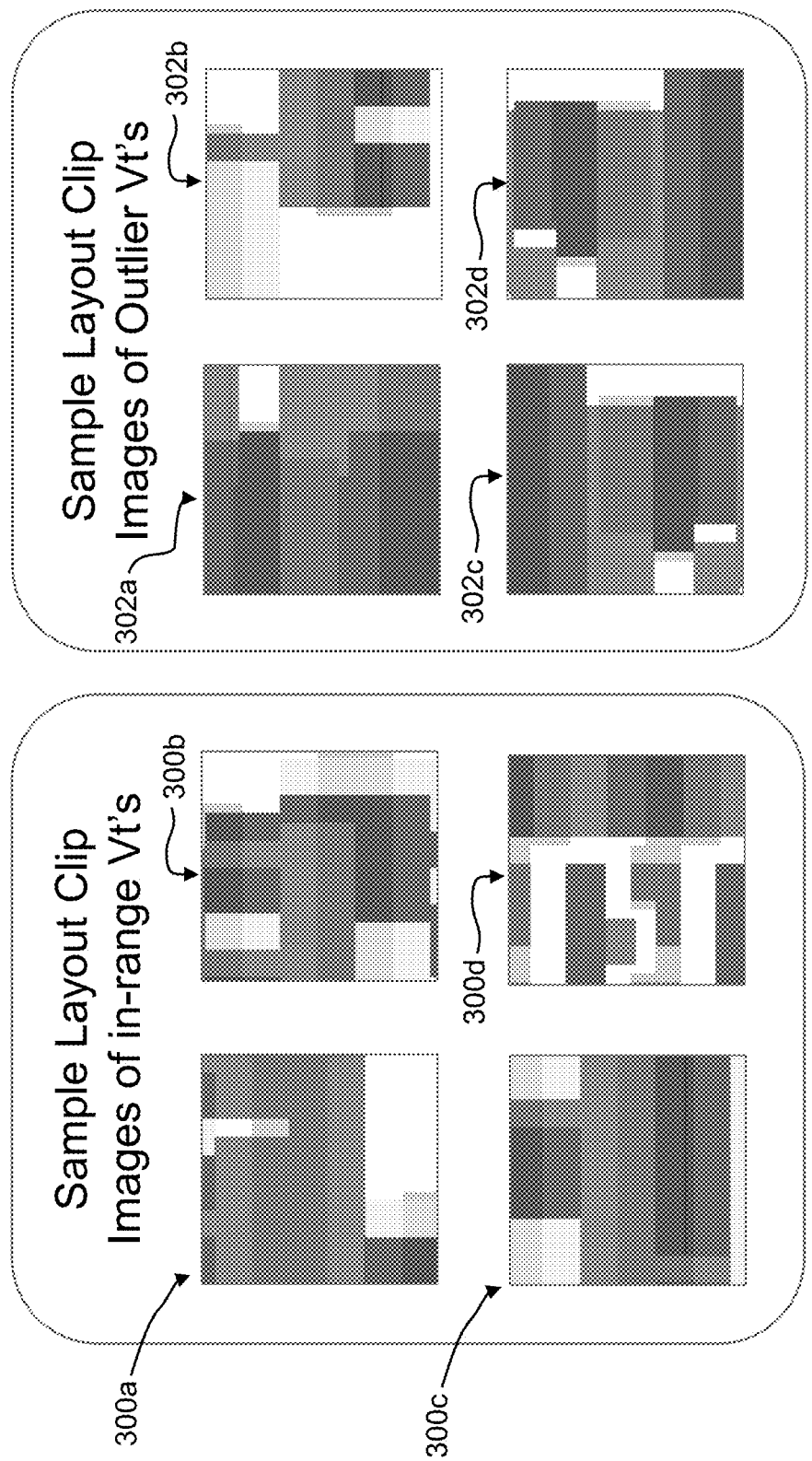
FIG. 3 depicts sample layout clip images of in-range and outlier circuit design patterns.

FIG. 3 depicts sample layout clip images of in-range circuit design patterns 300a, 300b, 300c, 300d (which produce in-range values of Vt) and outlier circuit design patterns 302a, 302b, 302c, 302d (which produce high or low values of Vt). Features of the layout images that correlate to in-range or high or low values of Vt are not apparent to a human observer, but can be detected by trained neural networks. The different regions in FIG. 3 correspond to different design layers, such as device marker layers as well as physical design layers such as source/drain regions and the like.

Figure 4:
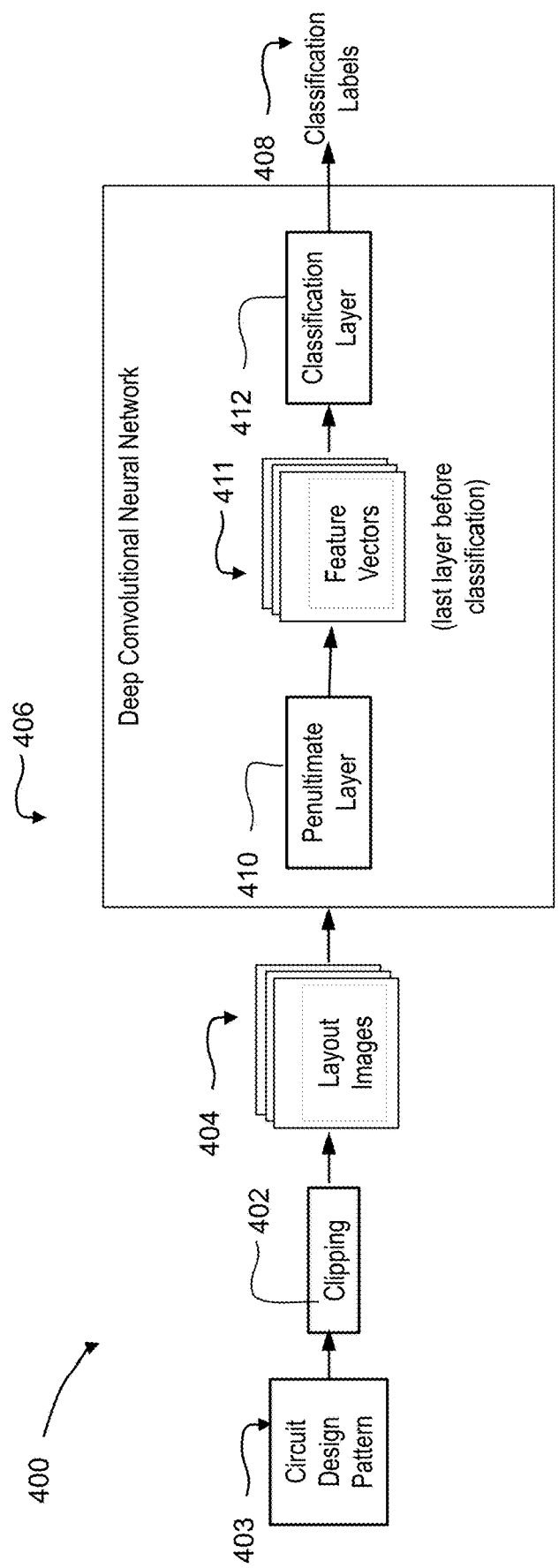
FIG. 4 depicts a deep learning architecture for producing feature vectors to be used in PCA, according to an exemplary embodiment.

FIG. 4 depicts a deep learning architecture 400 for producing feature vectors, which then can be used for clustering layout images, according to an exemplary embodiment. The architecture 400 includes an image clipping module 402, which receives circuit design patterns 403 and produces 3-D layout images 404. Embodiments provide for data preparation such that multi-layer integrated layout patterns may be input to a CNN. In some embodiments, the input for a CNN is a set of three-dimensional (3-D) layout images corresponding to 2-D images of multi-layered layouts that are stacked in a third dimension. Each of the stacked images is a specific layer of a multi-layer integrated circuit design pattern (e.g., the layout captured in a field of view (FOV)). Since an image may be represented as a two-dimensional (2-D) array of numbers, a 3-D layout image representing the multi-layer integrated circuit design pattern is constructed by stacking multiple layout images (e.g., 2-D layers) of the integrated layout pattern in the third dimension, which corresponds to the number of integrated layers. Digital images may have only three (e.g., red, green and blue or RGB) or four (e.g., cyan, magenta, yellow and key or CMYK) channels (e.g., in the third dimension, with image width and height being the other two dimensions). The 3-D layout images that are constructed in some embodiments can go beyond these channel limitations of digital images. The number of integrated layers can be as many or as few as desired.

In conventional circuit simulation/analysis, there is no reason to pre-process a circuit design pattern to produce layout images, because the visual appearance of the circuit layout plays no role in the numerical simulation of circuit performance. Furthermore, due to the scale and complexity of VLSI circuits, layout images are meaningless to human engineers. Thus, the pre-processing accomplished by the image clipping module 402 makes sense only in context of the current invention, which employs neural networks to accomplish deep visual analysis of the 3-D layout images 404.

The architecture 400 also includes a deep convolutional neural network (i.e. a computer vision machine learning algorithm) 406, which receives the layout images 404 and outputs classification labels 408. The neural network 406 includes a penultimate layer 410 that generates feature vectors 411, which are input to an ultimate classification layer 412 that generates the classification labels 408. In supervised embodiments, the classification labels 408 for the training layout images correspond to measured values of threshold voltage Vt, i.e. "in-range," "high," or "low."

The deep neural network 406 can be trained to classify layout images in a training set, for which threshold voltages have been experimentally measured, into "in-range" and "outlier" categories. There may be multiple "outlier" categories, e.g., "high" and "low" categories. At a penultimate layer of the trained neural network, it will produce n-dimensional feature vectors for each of the layout images. At an inference stage following training, the trained CNN can be applied to an inference set of layout images, for which threshold voltages have not been experimentally measured, and can classify those working layout images into "high," "low," or "in-range" categories based on the n-dimensional feature vectors that the CNN produces for each of the inference set of layout images.

Figure 5:
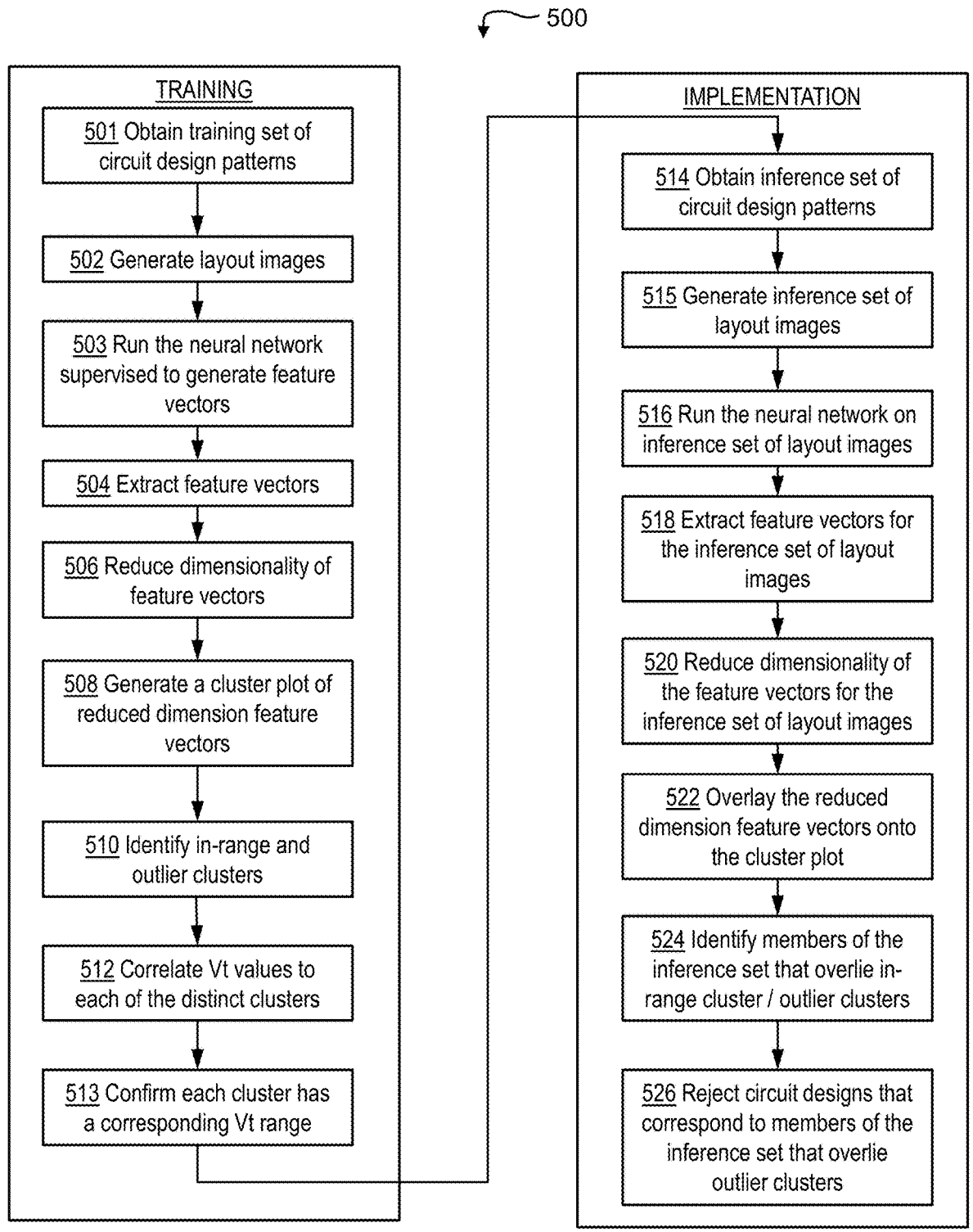
FIG. 5 depicts in a flowchart steps of a method for training and using the deep learning architecture of FIG. 4.

FIG. 5 depicts, in a flowchart, steps of a method 500 for training and using the deep learning architecture 400 of FIG. 4. Steps 501-513 include training. At 501, obtain a training set of circuit design patterns 403 and at 502 generate layout images 404 from the circuit design patterns. At 503, run the neural network 406 in a supervised manner on the set of layout images 404 to generate classifications 408 that correspond to values of threshold voltage (Vt) measured for each of the actually-fabricated circuit design patterns 403 (e.g., "high," "low," or "in-range"). At 504, extract the feature vectors 411 from the penultimate layer 410. At 506, undertake dimensionality reduction (e.g., principal component analysis (PCA), kernel PCA, isomapping, maximum variance unfolding, diffusion mapping, locally linear embedding, Laplacian eigenmapping, Hessian locally linear embedding, local tangent space analysis, summon mapping, multilayer autoencoders, locally linear coordination, manifold charting) of the feature vectors 411. At 508, generate a cluster plot of the dimensionality reduction (e.g., PCA) results. Note that dimensionality reduction is non-essential. In one or more embodiments, the feature vectors can be clustered without reducing dimensionality. Indeed, clustering does not require dimensionality reduction of feature vectors. Dimensionality reduction is optional and is appropriate in one or more embodiments for visualization which requires data of no more than three dimensions.

At 510, identify distinct clusters (in-range and outlier) on the cluster plot. At 512, correlate measured Vt values to each of the distinct clusters. At 513, confirm that each of the distinct clusters has a corresponding range or ranges of Vt values, e.g., at least most of the layout images that are grouped in an in-range cluster have in-range Vt values and at least most of the layout images that are grouped in one or more outlier clusters have extreme (outlier) Vt values.

Steps 514-526 include implementation. At 514, obtain an inference set of circuit design patterns for which Vt has not been measured. At 515, generate an inference set of layout images from the inference set of circuit design patterns. At 516, run the neural network 406 again on the inference set of layout images. At 518, extract the feature vectors for the inference set. At 520, generate reduced dimension feature vectors by performing dimensionality reduction on the feature vectors of the inference set. At 522, overlay the reduced dimension feature vectors from 520 onto the cluster plot from 508. At 524, identify members of the inference set that overlie an in-range cluster of the cluster plot and identify members of the inference set that overlie an outlier cluster of the cluster plot. At 526, reject the circuit design patterns that correspond to those members of the inference set that overlie any of the outlier cluster(s). Note, again, that dimensionality reduction is not essential, that the cluster plot may be many-dimensional (i.e. more than three dimensions), and that, in one or more embodiments, feature vectors can be clustered without reducing dimensionality.

Figure 6:
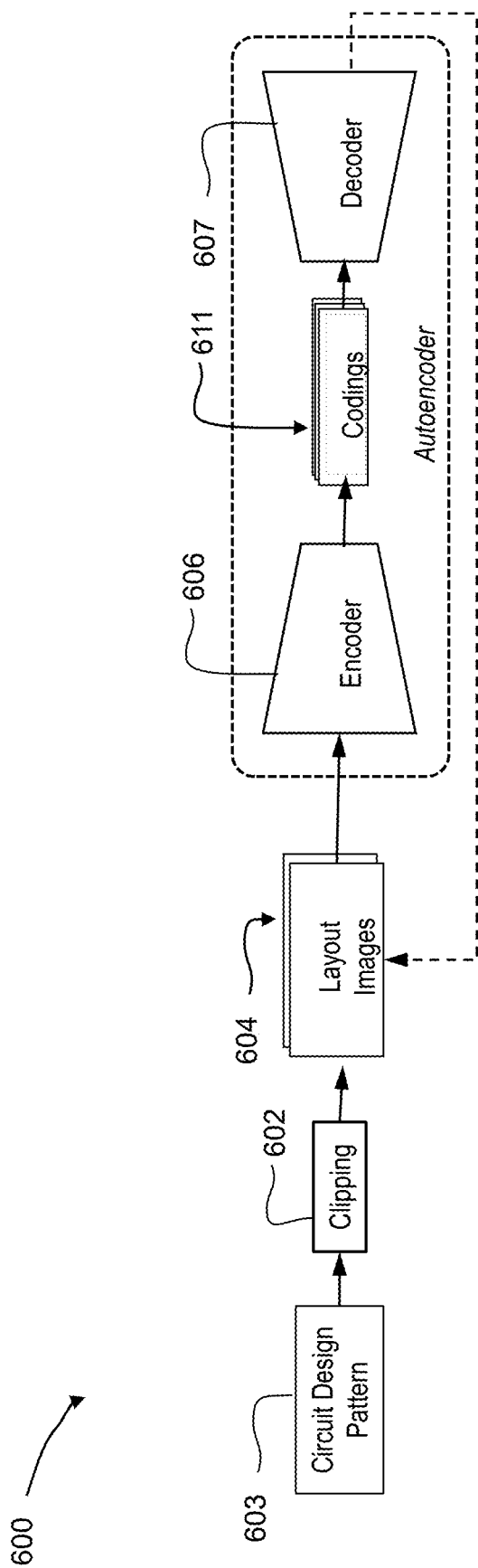
FIG. 6 depicts another deep learning architecture for producing feature vectors to be used in PCA, according to an exemplary embodiment.

FIG. 6 depicts another deep learning architecture 600 for producing feature vectors to be used in PCA, according to an exemplary embodiment. The architecture 600 includes an image clipping module 602, which receives circuit design patterns 603 and produces layout images 604, and also includes an encoder 606 (which can be but not limited to a set of convolutional neural network layers and/or fully connected layers) and a decoder 607 (which can be but not limited to a set of convolutional neural network layers and/or fully connected layers). Together, the encoder 606 and the decoder 607 form an autoencoder as further described below. The encoder 606 receives the layout images 604 and outputs feature vectors (intermediate codings) 611. The decoder 607 receives the feature vectors 611 and maps them back onto the layout images 604. As an example of operation, the autoencoder can be trained (in an unsupervised fashion) to produce codings from layout images, then to map the codings back onto the layout images. Architecturally, the autoencoder can have a form similar to that of a fully connected neural network, with an input layer, an output layer, and one or more hidden layers connecting the input and output layers. However, as a person skilled in the art will recognize, the autoencoder can include convolutional layers, or other types of computation layers different from a fully connected neural network. In the autoencoder, unlike most other types of neural network, the output layer has the same number of neurons as the input layer, and the hidden layers are trained for first encoding and then reconstructing the inputs to the autoencoder, instead of iterating to find weights to match the inputs to manually identified labels. Accordingly, autoencoders generate "unsupervised" learning models. By selecting the number of neurons in each hidden layer, and by selecting a number of hidden layers, the autoencoder compresses the input data (e.g., 3-D layout images) into intermediate codings and subsequently decompresses the codings to generate reconstructed images that are similar to the 3-D layout images. The reconstructed images per se are not necessarily pertinent in one or more embodiments; instead, the intermediate codings are features extracted from the input 3-D layout images. Then, at an inference or implementation stage following training, new codings or features could be extracted by the trained autoencoder from any new incoming layout images, after which clustering and visualization techniques can be applied to the intermediate codings (extracted features) to generate a plot of in-range and outlier clusters corresponding to in-range layout images and outlier layout images. The outlier layout images then can be disparaged as problematic designs and the corresponding circuit design patterns can be rejected. Optionally, actual threshold voltages may be experimentally measured for samples of circuit design patterns taken from each cluster of layout images. The experimental measurements then may be used to validate the cluster labels—e.g., if a cluster tentatively was labelled "in-range" but the majority of measured samples actually were out of range, then the cluster would be re-labelled as "outlier."

Figure 7:
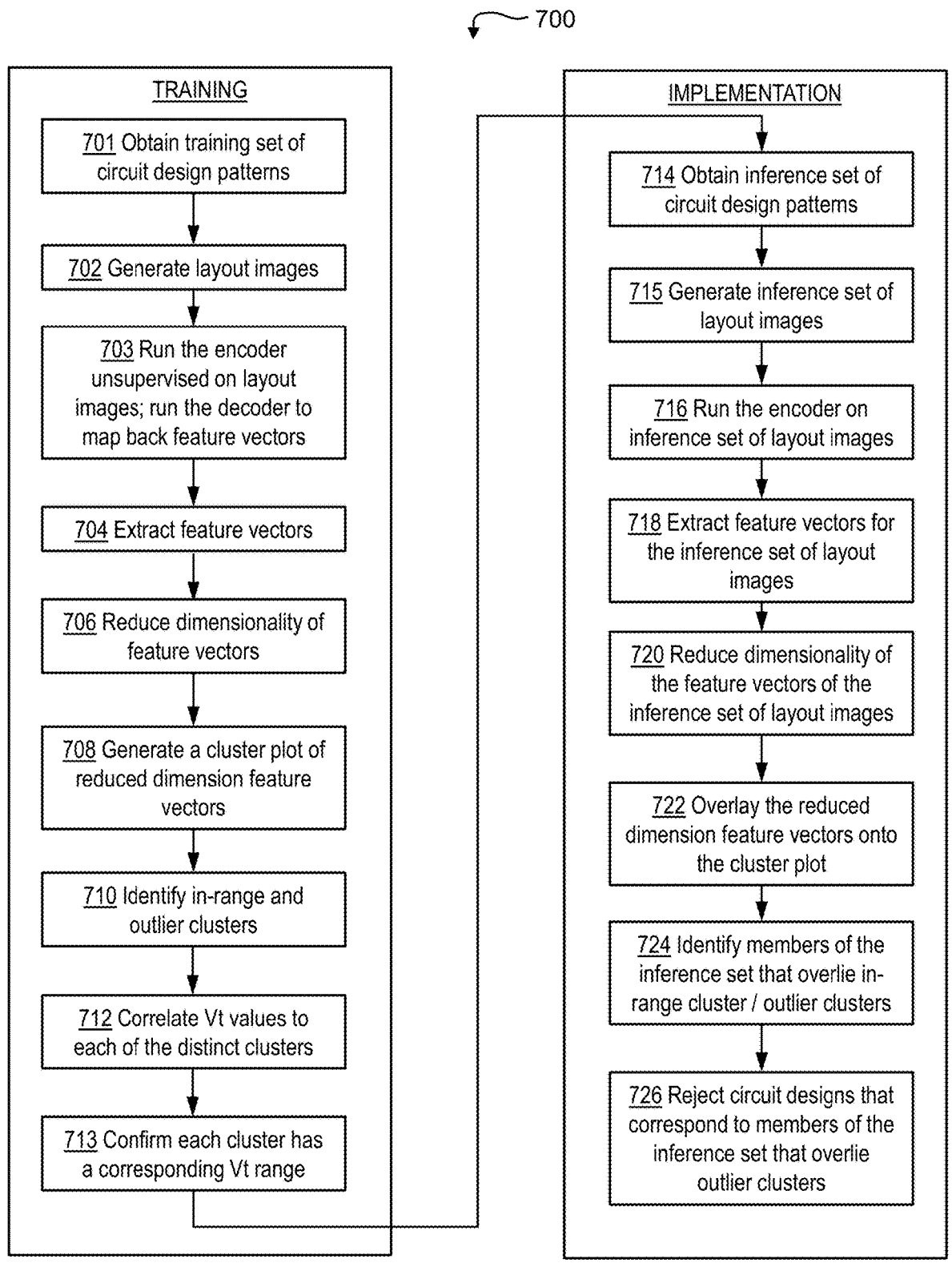
FIG. 7 depicts in a flowchart steps of a method for training and using the deep learning architecture of FIG. 6.

FIG. 7 depicts in a flowchart steps of a method 700 for training and using the deep learning architecture of FIG. 6. Steps 701-713 include training. At 701, obtain a training set of circuit design patterns 603. At 702, generate layout images 604 from the training set of circuit design patterns. At 703, run the encoder 606 on the set of layout images 604 to generate the feature vectors 611 and run the decoder 607 to map the feature vectors back onto the layout images 604. At 704, extract the feature vectors 611 from the encoder 606. At 706, undertake dimensionality reduction (e.g., principal component analysis (PCA)) of the feature vectors 611. (As mentioned above, dimensionality reduction is an optional step. It is possible to cluster feature vectors without reducing dimensionality. Such clustering could produce a 2-, 3-, or many-dimensional cluster plot at step 708.) At 708, generate a cluster plot of the reduced dimension feature vectors. At 710, identify distinct clusters (in-range and outlier) on the cluster plot, for example, using machine vision to segment the data into distinct clusters. At 712, correlate measured Vt values to each of the distinct clusters. At 713, confirm that each of the distinct clusters has a corresponding range or ranges of Vt values, e.g., each of the layout images that is grouped in an in-range cluster has an in-range Vt value and each of the layout images that is grouped in one or more outlier clusters has an extreme (outlier) Vt value.

Steps 714-726 include implementation. At 714 obtain an inference set of circuit design patterns for which no Vt values have been measured, and at 715 generate an inference set of layout images based on those circuit design patterns. At 716, run the encoder 606 again on the inference set of layout images. At 718, extract the feature vectors for the inference set. At 720, optionally, reduce dimensionality of the feature vectors of the inference set. At 722, overlay the reduced dimension feature vectors from 720 onto the cluster plot from 708. At 724, identify members of the inference set that overlie an in-range cluster of the cluster plot and identify members of the inference set that overlie an outlier cluster of the cluster plot. At 726, reject the circuit design patterns that correspond to those members of the inference set that overlie any of the outlier cluster(s).

In one or more embodiments, classification labels are not essential. Without classifying layout images, clusters can be identified in the feature space, and it can be assumed that a majority cluster will be the in-range cluster. In case classification labels are desired to validate this assumption, the clusters can be categorized by testing samples from each sample after clustering. Thus, an autoencoder process might be preferred if pre-existing labels were not available, however a CNN might be preferable in case a large corpus of threshold voltage measurements already were available.

In the unsupervised protocol, it is helpful, but not essential, to obtain actual measurements of threshold voltage. Optionally, dimensionality reduction and clustering can be used alone to identify "in-range" (majority) and "outlier" (minority) clusters of feature vectors for various layout images.

Also, in the unsupervised protocol it is not essential to have separate training and inference sets of circuit design patterns and layout images. Instead, after feature vectors (intermediate codings) have been extracted from an initial set of layout images, and after clusters have been identified using dimensionality reduction techniques, a few experimental measurements of threshold voltages can be taken for a sampling of actually-fabricated circuit designs corresponding to each of the clusters. Then, based on the experimental measurements, clusters and their members (including non-fabricated circuit design patterns for which threshold voltage has not been measured) can be identified as "in-range" or "high" or "low."

In one or more embodiments, the feature extraction aspect is helpful for a circuit designer to obtain insight as to what circuit features might trigger local layout effect. Then it might be possible to eliminate LLE by changing single features of a circuit design. Also, clustering on feature vectors can give clarity where confidence of the classification labels is moderate.

It is worth noting that conventional modeling methods employ "numbers in" and "numbers out." However, it is difficult to quantize design "style," and even if this was possible, too many numbers would be needed to describe a layout design. Advantageously, one or more embodiments overcome the need for quantizing layout style and directly use layout(s) as inputs, and thus are more convenient, accurate, and/or easy.

Figure 8:
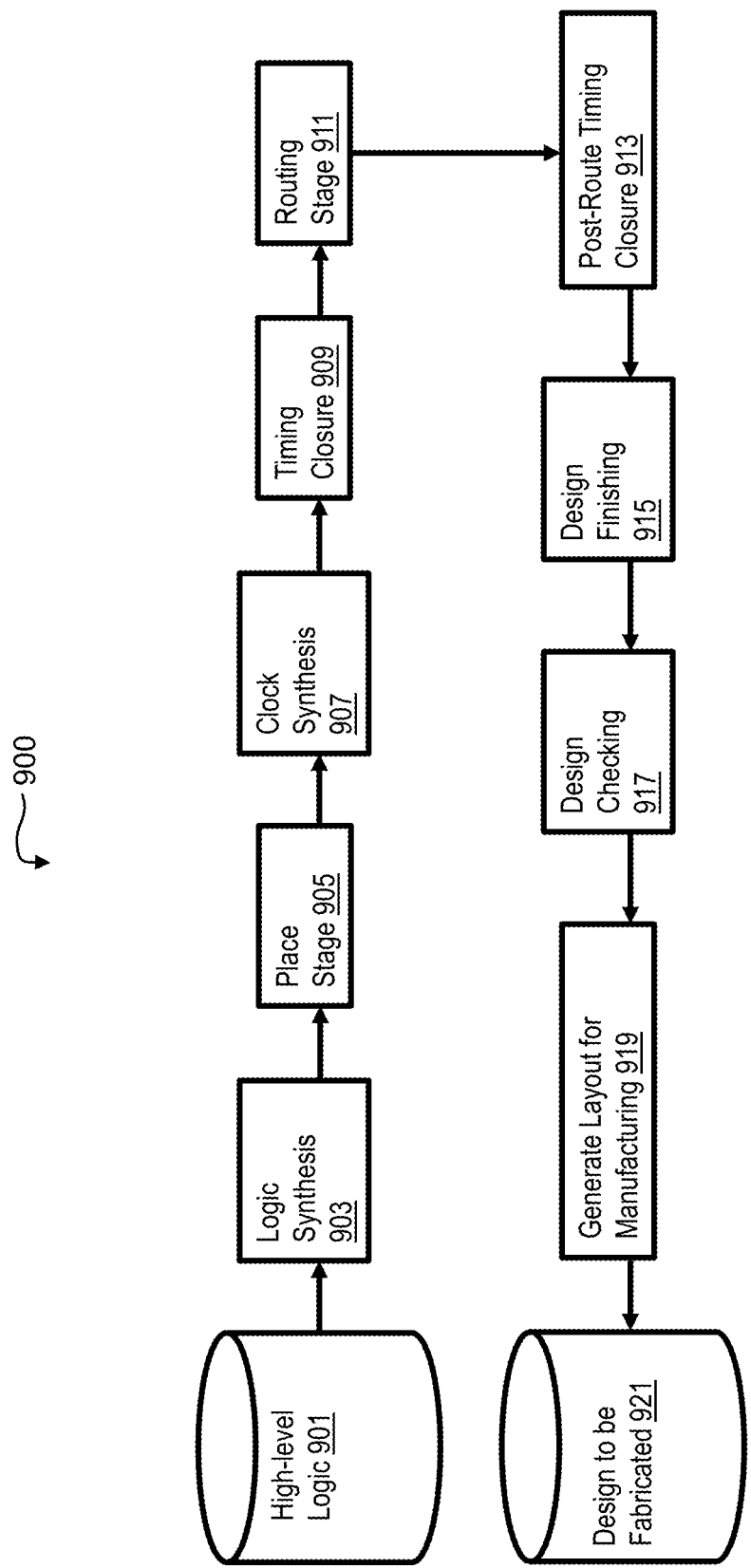
FIG. 8 depicts in a flowchart steps of an overall circuit design and fabrication process in which exemplary embodiments are implemented.

FIG. 8 depicts an example high-level Electronic Design Automation (EDA) tool flow 900, which is responsible for creating an optimized microprocessor (or other IC) design to be manufactured. A designer could start with a high-level logic description 901 of the circuit (e.g. VHDL or Verilog). The logic synthesis tool 903 compiles the logic, and optimizes it without any sense of its physical representation, and with estimated timing information. The placement tool 905 takes the logical description and places each component, looking to minimize congestion in each area of the design. The clock synthesis tool 907 optimizes the clock tree network by cloning/balancing/buffering the latches or registers. The timing closure step 909 performs a number of optimizations on the design, including buffering, wire tuning, and circuit repowering; its goal is to produce a design which is routable, without timing violations, and without excess power consumption. The routing stage 911 takes the placed/optimized design, and determines how to create wires to connect all of the components, without causing manufacturing violations. Post-route timing closure 913 performs another set of optimizations to resolve any violations that are remaining after the routing. Design finishing 915 then adds extra metal shapes to the netlist, to conform with manufacturing requirements. The checking steps 917 analyze whether the design is violating any requirements such as manufacturing, timing, power, electromigration or noise, and the like. When the design is clean, the final step 919 is to generate a layout for the design, representing all the shapes to be fabricated in the design to be fabricated 921.

Generally, embodiments of the present invention apply machine learning computer vision to the visual appearance of layout images produced from a circuit design pattern. Accordingly, embodiments are implemented subsequent to step 919 of generating a layout, so that the layout image(s) can be obtained and input to the neural network. Thus, in case a circuit design pattern is rejected based on the result of an embodiment of the invention, then the process of FIG. 8 would revert back to a previous step such as the routing stage 911. It is at this time that it would be particularly helpful for a circuit designer to review the features extracted by embodiments of the invention, in order to gain insight as to how to adjust the circuit design pattern.

By way of clarification, FIGS. 5 and 7 include training and implementation (inference). Data for training, or a training dataset, can have corresponding labels associated in the case of CNN classification. It is used as input to a machine learning (ML) model to be "trained" to determine model parameters. Once this training step is finished, the ML model is fixed, i.e. model parameters will not change afterwards (in the inference step). Data for inference is new data, never seen by the model, which is to be "inferenced" for a label by the model. Such a label is generated by passing the data through the fixed model. Any new data for a trained model to predict a label is data for inference. Accordingly, reference is made herein to training sets and inference sets.

Given the discussion thus far, and with reference to the accompanying drawing Figures, it will be appreciated that, in general terms, an exemplary method 500 for rejecting a circuit design pattern that is predicted to have local layout effect includes at 701 obtaining a plurality of circuit design patterns 403; at 702 generating a plurality of layout images 404 each corresponding to one of the plurality circuit design patterns; at 703 training a computer vision machine learning algorithm in an unsupervised fashion to generate a training set of feature vectors or encodings 611 for the plurality of layout images; and at 704 extracting feature vectors 611 from the layout images. The exemplary method also includes at 708 generating a cluster plot of the feature vectors. Then at 710 the method further includes identifying an in-range cluster and an outlier cluster on the cluster plot. At 724 the method includes identifying a circuit design pattern that corresponds to a layout image that produced a feature vector within the outlier cluster, and at 726 rejecting the identified circuit design pattern.

In one or more embodiments, the exemplary method also includes actually fabricating samples of circuit design patterns that correspond to feature vectors present in each of the clusters; and identifying the in-range cluster and the outlier cluster based on experimental measurements of threshold voltage for actually-fabricated circuit design patterns that are present in each of the clusters.

In one or more embodiments, principal component analysis (PCA) is used for dimensionality reduction of the feature vectors.

In one or more embodiments, partitional clustering (e.g., k-means clustering) is used to cluster the feature vectors. Alternatively, density based clustering or hierarchical clustering can be used. After clustering the feature vectors, the in-range cluster and the outlier cluster may be identified based on a heuristic such as the in-range cluster having a certain number more members than each of the outlier cluster(s) (e.g., a simple majority, 10% more, 70% to 30%, 80% to 20%) or having greater density than the outlier cluster(s). Other suitable heuristics will be apparent to the skilled worker. The most direct heuristic is to actually fabricate sample circuit designs represented in each cluster, measure threshold voltages, and determine on that basis which cluster is "in-range" and which cluster(s) are "outliers."

In one or more embodiments, the computer vision machine learning algorithm includes an autoencoder. In other embodiments, the computer vision machine learning algorithm includes a combination of a CNN with an autoencoder.

According to another aspect, an exemplary method for rejecting circuit design patterns that are predicted to have local layout effect includes at 701 obtaining a plurality of circuit design patterns 603; at 702 generating a plurality of layout images 604 each corresponding to one of the plurality of circuit design patterns; at 703 training a computer vision machine learning algorithm in an unsupervised fashion to generate a training set of feature vectors 611 for the plurality of layout images; and at 708 generating a cluster plot of the feature vectors. At 710 the method includes identifying an in-range cluster and an outlier cluster on the cluster plot. The exemplary method also includes at 714 obtaining an inference set of circuit design patterns; at 715 generating an inference set of layout images each corresponding to one of the inference set of circuit design patterns; at 718 using the computer vision machine learning algorithm to generate an inference set of feature vectors for the inference set of layout images; at 722 plotting on the cluster plot the inference set of feature vectors; and at 724 identifying outlier members of the inference set of layout images that produced feature vectors that overlie the outlier cluster on the cluster plot. Further, at 726 the method includes rejecting circuit design patterns that correspond to the outlier members of the inference set of layout images.

In one or more embodiments, identifying the in-range cluster and the outlier cluster includes actually fabricating samples of circuit design patterns from each of the clusters and experimentally measuring threshold voltage of at least one sample from each of the clusters. In one or more embodiments, identifying the in-range cluster and the outlier cluster includes counting a number of members in each of the clusters. In one or more embodiments, partitional clustering is used to identify the in-range and outlier clusters.

In one or more embodiments, the cluster plot is a 2-dimensional cluster plot that is obtained by reducing dimensionality of the feature vectors.

In one or more embodiments, the computer vision machine learning algorithm includes a convolutional neural network (CNN). In other embodiments, the computer vision machine learning algorithm includes an autoencoder. In other embodiments, the computer vision machine learning algorithm includes a combination of a CNN with an autoencoder.

Another aspect provides an exemplary method for rejecting a circuit design pattern that is predicted to have local layout effect, which includes at 501 obtaining a plurality of circuit design patterns; at 502 generating layout images from the circuit design patterns; at 504 extracting feature vectors from the layout images by processing the layout images in a computer vision machine learning algorithm; at 522 comparing the feature vector extracted from a selected layout image to clusters of feature vectors extracted from the layout images, wherein the clusters of feature vectors include an in-range cluster and an outlier cluster; and at 526 rejecting a circuit design pattern corresponding to the selected layout image, for which threshold voltage has not been experimentally measured, as being an outlier circuit design pattern, in response to the feature vector of the selected layout image correlating with the outlier cluster.

In one or more embodiments, the computer vision machine learning algorithm is trained in a supervised fashion based on measured values of threshold voltage for a majority of the circuit design patterns.

Figure 9:
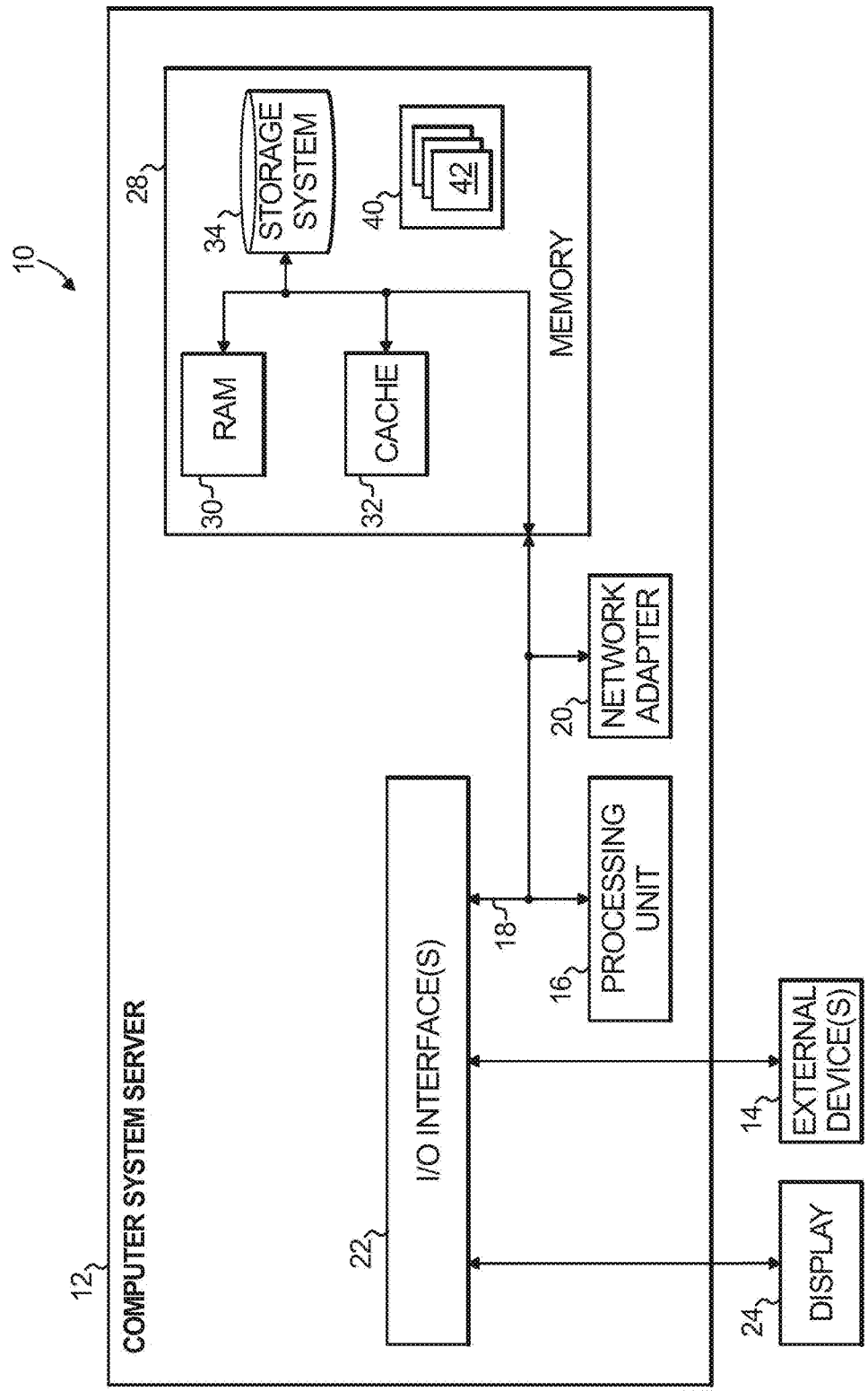
FIG. 9 depicts a computer system that may be useful in implementing one or more aspects and/or elements of the invention.

One or more embodiments of the invention, or elements thereof, can be implemented in the form of an apparatus including a memory and at least one processor that is coupled to the memory and operative to perform exemplary method steps, or in the form of a non-transitory computer readable medium embodying computer executable instructions which when executed by a computer cause the computer to perform exemplary method steps. FIG. 9 depicts a computer system that may be useful in implementing one or more aspects and/or elements of the invention, also representative of a cloud computing node according to an embodiment of the present invention. Referring now to FIG. 9, cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 9, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Thus, one or more embodiments can make use of software running on a general purpose computer or workstation. With reference to FIG. 9, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 9) running a server program. It will be understood that such a physical server may or may not include a display and keyboard.

One or more embodiments can be at least partially implemented in the context of a cloud or virtual machine environment, although this is exemplary and non-limiting; the system of FIG. 9 is also representative of non-cloud implementations.

It should be noted that any of the methods described herein can include an additional step of providing a system comprising distinct software modules embodied on a computer readable storage medium; the modules can include, for example, any or all of the appropriate elements depicted in the block diagrams and/or described herein; by way of example and not limitation, any one, some or all of the modules/blocks and or sub-modules/sub-blocks described. The method steps can then be carried out using the distinct software modules and/or sub-modules of the system, as described above, executing on one or more hardware processors such as 16. Further, a computer program product can include a computer-readable storage medium with code adapted to be implemented to carry out one or more method steps described herein, including the provision of the system with the distinct software modules.

Exemplary System and Article of Manufacture Details

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for rejecting a circuit design pattern that is predicted to have local layout effect, comprising:
    obtaining a plurality of circuit design patterns;
    generating a plurality of layout images each corresponding to one of the plurality of circuit design patterns;
    training a computer vision machine learning algorithm in an unsupervised fashion to generate a training set of feature vectors for the plurality of layout images;
    generating a cluster plot of the training set of feature vectors;
    identifying an in-range cluster and an outlier cluster on the cluster plot;
    identifying a circuit design pattern that corresponds to a layout image that produced a feature vector within the outlier cluster; and
    rejecting the identified circuit design pattern.

2. The method of claim 1 further comprising:
    fabricating samples of circuit design patterns that correspond to feature vectors present in each of the clusters; and
    identifying the in-range cluster and the outlier cluster based on experimental measurements of threshold voltage for samples that are present in each of the clusters, wherein experimental measurements for samples in the outlier cluster indicate local layout effect.

3. The method of claim 2 further comprising using principal component analysis for dimensionality reduction of the training set of feature vectors.

4. The method of claim 1 further comprising:
clustering the feature vectors; and
identifying the in-range cluster and the outlier cluster based on the in-range cluster having more members than the outlier cluster.

5. The method of claim 1 wherein partitional clustering is used to cluster the feature vectors.

6. The method of claim 1 wherein the computer vision machine learning algorithm includes an autoencoder that extracts the feature vectors as intermediate codings from the layout images.

7. A method for rejecting circuit design patterns that are predicted to have local layout effect, comprising:
obtaining a plurality of circuit design patterns;
generating a plurality of layout images each corresponding to one of the plurality of circuit design patterns;
training a computer vision machine learning algorithm in an unsupervised fashion to generate a training set of feature vectors for the plurality of layout images;
generating a cluster plot of the training set of feature vectors;
identifying an in-range cluster and an outlier cluster on the cluster plot;
obtaining an inference set of circuit design patterns;
generating an inference set of layout images each corresponding to one of the inference set of circuit design patterns;
using the computer vision machine learning algorithm to generate an inference set of feature vectors for the inference set of layout images;
plotting on the cluster plot the inference set of feature vectors;
identifying outlier members of the inference set of layout images that produced feature vectors that overlie the outlier cluster on the cluster plot; and
rejecting circuit design patterns that correspond to the outlier members of the inference set of layout images.

8. The method of claim 7 wherein identifying the in-range cluster and the outlier cluster includes fabricating at least one sample of a circuit design pattern from each of the clusters and experimentally measuring threshold voltage of the at least one sample from each of the clusters, wherein experimental measurements for samples in the outlier cluster indicate local layout effect.

9. The method of claim 7 wherein identifying the in-range cluster and the outlier cluster includes counting a number of members in each of the clusters.

10. The method of claim 7 wherein the cluster plot is a 2-dimensional cluster plot produced by reducing dimensionality of the training set of feature vectors, and dimensionality of the inference set of feature vectors is reduced before plotting the inference set of feature vectors on the cluster plot.

11. The method of claim 7 wherein partitional clustering is used to identify the in-range and outlier clusters.

12. The method of claim 7 wherein the computer vision machine learning algorithm includes a convolutional neural network.

13. The method of claim 7 wherein the computer vision machine learning algorithm includes an autoencoder that extracts the feature vectors as intermediate codings from the layout images.

14. A method for rejecting a circuit design pattern that is predicted to have local layout effect, comprising:
obtaining a plurality of circuit design patterns;
generating layout images from the circuit design patterns;
extracting feature vectors from the layout images by processing the layout images in a computer vision machine learning algorithm;
comparing the feature vector extracted from a selected layout image to clusters of feature vectors extracted from the layout images, wherein the clusters of feature vectors include an in-range cluster and an outlier cluster; and
rejecting a circuit design pattern corresponding to the selected layout image, for which threshold voltage has not been experimentally measured, as being a circuit design pattern that is predicted to have local layout effect, in response to the feature vector of the selected layout image correlating with the outlier cluster.

15. The method of claim 14 further comprising:
fabricating samples of at least some of the circuit design patterns; and
identifying the in-range cluster and the outlier cluster based on experimental measurements of threshold voltage for samples that are present in each of the clusters, wherein experimental measurements for samples in the outlier cluster indicate local layout effect.

16. The method of claim 14 further comprising:
clustering the feature vectors; and
identifying the in-range cluster and the outlier cluster based on the in-range cluster having more members than the outlier cluster.

17. The method of claim 16 wherein partitional clustering is used to cluster the feature vectors.

18. The method of claim 14 wherein the computer vision machine learning algorithm includes a convolutional neural network.

19. The method of claim 18 wherein the computer vision machine learning algorithm is trained in a supervised fashion based on measured values of threshold voltage for a majority of the circuit design patterns.

20. The method of claim 14 wherein the computer vision machine learning algorithm includes an autoencoder that extracts the feature vectors as intermediate codings from the layout images.

* * * * *